United States Patent
Goldberg et al.

(10) Patent No.: US 7,027,226 B2
(45) Date of Patent: Apr. 11, 2006

(54) DIFFRACTIVE OPTICAL ELEMENT FOR EXTREME ULTRAVIOLET WAVEFRONT CONTROL

(75) Inventors: Kenneth Alan Goldberg, Berkeley, CA (US); Patrick P. Naulleau, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 272 days.

(21) Appl. No.: 09/956,160

(22) Filed: Sep. 17, 2001

(65) Prior Publication Data

US 2003/0081316 A1 May 1, 2003

(51) Int. Cl.
*G02B 1/00* (2006.01)
*G02B 5/18* (2006.01)
*G03F 9/00* (2006.01)

(52) U.S. Cl. .................... 359/587; 359/580; 359/569; 359/361; 430/5

(58) Field of Classification Search ............... 359/565, 359/566, 569, 571, 573, 575, 576, 580, 587, 359/361; 430/5, 4, 332, 324, 323, 322; 349/201; 378/34, 35
See application file for complete search history.

(56) References Cited

U.S. PATENT DOCUMENTS

| | | | | |
|---|---|---|---|---|
| 4,729,640 A | * | 3/1988 | Sakata | .................... 349/201 |
| 4,890,309 A | | 12/1989 | Smith et al. | |
| 5,000,575 A | | 3/1991 | Southwell et al. | |
| 5,433,988 A | | 7/1995 | Fukuda et al. | |
| 5,521,031 A | * | 5/1996 | Tennant et al. | ................ 430/5 |
| 5,714,285 A | | 2/1998 | Tu et al. | |
| 5,738,959 A | | 4/1998 | Miyashita et al. | |
| 5,939,225 A | | 8/1999 | Dove et al. | |
| 5,995,285 A | * | 11/1999 | Unno | ..................... 359/565 |
| 6,480,332 B1 | * | 11/2002 | Nakai | ..................... 359/566 |
| 6,524,755 B1 | * | 2/2003 | Jin et al. | ..................... 430/5 |
| 6,686,098 B1 | * | 2/2004 | Czech et al. | .................. 430/5 |

* cited by examiner

*Primary Examiner*—Audrey Chang
(74) *Attorney, Agent, or Firm*—Cascio Schmoyer & Zervas

(57) ABSTRACT

A wavefront modulating optical element device employs two or more materials lithographically patterned with programmed thickness profiles. The spatially-varying thickness profiles are chosen to yield arbitrary relative phase-shift and attenuation upon transmission. The device can be designed to create arbitrary diffractive optical elements with specific applications including diffusers, arbitrary holographic optical elements, null-elements for wavefront compensation and control in interferometry.

19 Claims, 4 Drawing Sheets

DIFFRACTIVE OPTICAL ELEMENT FOR EXTREME ULTRAVIOLET WAVEFRONT CONTROL

FIELD OF THE INVENTION

The invention relates to elements for wavefront phase control and particularly to diffractive light phase- and amplitude-controlling devices that are particularly suitable for use at extreme ultraviolet wavelengths.

BACKGROUND OF THE INVENTION

Extreme ultraviolet (EUV) optical systems, developed for wavelengths in the 11–14 nm range hold great promise for applications in semiconductor lithography. Over time, the sophistication of EUV optical systems has increased, and many techniques developed for use at longer, optical and ultraviolet wavelengths are finding application in EUV technology. Among the promising new techniques being applied in the EUV are those that can control the wavefront of an EUV beam. Such devices include phase-shift masks for advanced lithography, special purpose gratings to be used, for example, in shearing interferometry, holographic optical elements for use as interferometric null elements, and diffusers for use in illumination systems.

Optical elements that operate in transmission have been used in EUV applications for many years. These elements most often consist of lithographically patterned absorber regions on very thin free-standing membranes. One-thousand to 2000-Å-thick silicon-nitride membranes are commonly used as the membrane material; nickel, cobalt, and gold, are often used as the absorber.

Achieving optimal utility from wavefront-modulating devices requires independent control of both the amplitude and the phase of the wavefront. Such control has yet to be demonstrated at EUV mostly due to the strong absorption that accompanies transmission through all solid materials, and hence, the lack of non-absorbing phase-shift materials.

Among known and available materials, molybdenum has a relatively high phase-shift-to-attenuation ratio. Recently, EUV imaging with phase-shift-enhanced masks has been demonstrated using patterned molybdenum masks. These demonstrations, however, have been limited to so-called attenuated phase shift masks due to the inherent absorption of molybdenum at EUV wavelengths. It would be highly desirable to fabricate strong-phase-shift masks, in which attenuation is balanced between the phase-shifting and the non-phase-shifting regions of the mask.

Optical system testing and characterization are areas of EUV optics in which at-wavelength testing has made great advances in recent years. Shearing interferometry has emerged as a promising option for future high-accuracy EUV interferometers. In ideal cases, shearing interferometry is performed by interfering two or more sheared, or displaced, copies of a wavefront under test. Several demonstrations of EUV shearing interferometry have incorporated binary amplitude gratings as the beam-splitting element. When small shear ratios are used, multiple-orders overlap causing potential confusion in the analysis. In principle, the zero-order beam could be eliminated using a phase grating, however, when the phase shift material also attenuates, as is the case with EUV light, a duty cycle (fraction of open area) other than 50% must be used. Deviation from 50% duty cycle causes the appearance of the even diffracted orders, which are absent from 50% duty cycle binary gratings. In this circumstance, to limit the presence or magnitude of unwanted grating orders, it would be desirable to fabricate a device in which the attenuation is evenly balanced between the phase-shifting and the non-phase-shifting regions of the device. In this way, a pure-phase grating could be produced, albeit with some spatially uniform absorption magnitude.

Interferometric testing of aspherical optical elements is often performed in the visible and ultraviolet wavelength ranges using well-characterized null elements to restore a spherical wavefront profile, modulating the wavefront phase with constant amplitude. At present, while no such analogous devices are used for EUV interferometry, the methodology is clear by extension from techniques used at longer wavelengths.

Diffusing elements play an important role in optical illumination systems. Such devices, however, are difficult to fabricate in transmission mode at EUV wavelengths due to strong absorption in phase-shifting materials. In order to generate the thinnest possible EUV transmission diffuser, the attenuation must be balanced at all phase shift values.

SUMMARY OF THE INVENTION

The present invention is based in part on the recognition that two materials with different optical properties can be employed to manipulate the phase and amplitude of a transmitted beam. The phase-shifting and attenuation properties of the two materials are used in combination to achieve arbitrary relative phase and amplitude changes upon transmission or reflection. On transmission through a device patterned to have different material thicknesses in different areas, a beam of light can be modified in a controlled manner. In this way, arbitrary holographic optical elements can be created. Such devices include diffusers for spatial coherence control, phase-shifting masks, and holographic null elements for the interferometric testing of aspheric optics, among others.

In embodiment, the invention is directed to a diffractive optical element for radiation wavefront control that includes:

a pattern of at least two bilayer structures with each structure comprising a first layer of a first material and a second layer of a second material wherein the first material has a different index of refraction than that of the second material and characterized in that incident radiation passing through a first bilayer structure is phase shifted relative to the radiation passing through a second bilayer structure by a desired value.

Typically, the pattern of bilayered structure is formed on the planar surface of a substrate which may be substantially transmissive or reflective of the radiation, depending on the application. In a preferred embodiment, the first and second materials are selected from the following pairs of materials: (i) beryllium and silicon, (ii) molybdenum and carbon, and (iii) ruthenium and nickel.

In another embodiment, the invention is directed to a diffractive optical element for radiation wavefront control that includes:

a pattern of at least two structures with a first structure that has a layer of a first material and a second structure that has a layer of a second material wherein the first material has a different index of refraction than that of the second material and characterized in that incident radiation passing through the first structure is phase shifted relative to radiation passing through the second structure by a desired value.

DESCRIPTION OF PREFERRED EMBODIMENTS

Figure 1:
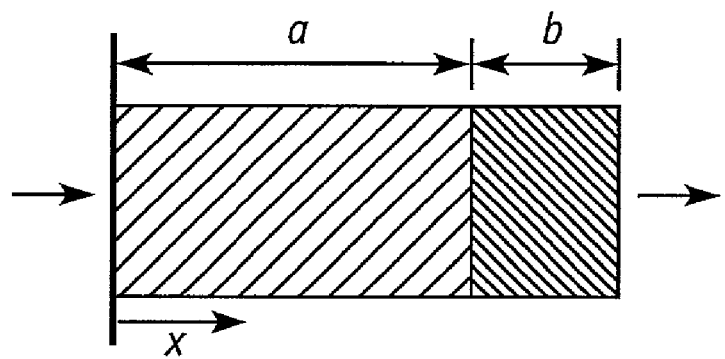
FIG. 1 illustrates the propagation of radiation through a bi-layer material.

Diffractive optical elements of the present invention are particularly suited for EUV applications. The diffractive optical element generally comprises a substrate or membrane onto which is deposited a plurality of structures each preferably comprising two materials of different indices of refraction. The diffractive optical element can be designed to modulate a wavefront's phase and amplitude in transmission. One preferred embodiment allows the phase to be modulated while maintaining constant net transmission through the system. The fabrication of the bilayer structures is accomplished by material deposition and lithographic techniques that are well known in the art.

For EUV applications, the membrane used preferably is formed of silicon nitride ($Si_3N_4$). With thicknesses between 1000 angstroms (100 nm) and 2000 angstroms, the membranes are fairly transparent and can exist in free-standing form (no holes or apertures) covering areas as large as a square centimeter. Typically, silicon nitride membranes widths are about 0.5 cm since larger ones can be very fragile. Silicon which is relatively transparent for EUV can also be employed as the membrane material.

Another embodiment of the membrane includes a layer of silicon nitride that is deposited onto a silicon wafer. Thereafter a hole is etched away from the back side of the wafer thereby leaving the silicon nitride membrane as a free-standing substrate over the hole. Radiation passes through the hole before or after reaching the bilayer structures. An important consideration in designing the membrane is stress, since residual stress in the membrane will cause the membrane to break if it is too great.

Preferred diffractive optical elements of the present invention have bilayer structures formed on top of a solid and continuous membrane. Light that goes through one region of the device changes its amplitude and phase depending on the material thicknesses at that region. Light passing through a different region changes by a different amount. Since all of the light will pass through the same thickness of the membrane it will be affected (e.g., attenuated) in the same way.

The bilayer structures can also be formed as free standing, that is, without a membrane per se. For example, one of the bilayer materials also functions as the membrane to support the structure. In this embodiment, there may be some reduction in the range of phase and intensity changes one can induce without having too much attenuation. With the diffractive optical element of the present invention, the radiation is phase shifted by any desired value; typically the radiation is phase shifted from zero to $2\pi$ radians. Alternatively, or in addition, the radiation is subject to amplitude transmission reduction that ranges from 100% to less than 1%

The present invention is also applicable to optical elements designed to operate in reflection. In this case, the bilayer structures are formed on a reflective surface. For EUV optical systems, reflection at normal incidence is achieved using resonant-reflective multilayer (e.g., Mo/Si) mirrors. Depending on the composition of the multilayer coating, the reflectivity can vary across a wide range. Reflectivity of nearly 70% has been demonstrated with Mo/Si coatings at 13.4-mm wavelength. Care must be taken in the design to ensure that the effects of thin-film interference (in the bilayer) are fully accounted for in the design of the optical element.

A. A Two-Material Wavefront Modulating Optical Element

Realizing the full potential of wavefront shaping techniques requires independent control of both attenuation and phase shift. By using two materials, one with a different phase-shifting and/or attenuation strength than the other (i.e. they have different indices of refraction) optical elements can be fabricated that have uniform or arbitrary transmission profiles independent of the phase shift.

By spatially varying the thicknesses of the two materials the phase-shift on transmission can be set independent of the transmitted intensity. Furthermore, if the absorptivity of the two materials can be closely matched, and uniform transmitted intensity is desired, then the total thickness of the transmission diffractive optical element (DOE) can be made constant.

Analysis yields the relationships between the materials' properties, the layer thicknesses and the phase-shifts in the material. For EUV materials, the complex index of refraction, n, is close to one. The index is typically broken into real and imaginary components $1-\delta$ and $i\beta$. Consider two materials labeled a and b with complex indices of refraction $n_a$ and $n_b$: the indices of refraction are represented by $n_a=1-\delta_a+i\beta_a$ and $n_b=1-\delta_b+i\beta_b$, respectively. For this derivation, assume that material a has greater phase-shifting strength than material b. This means that $|\delta_a|$ is greater than $|\delta_b|$.

A monochromatic plane wave propagating through a material with index, n, evolves in the x direction as:

$$E(x) = \exp[inkx] = \exp[ik(1-\delta+i\beta)x] \qquad (1)$$
$$= \exp[ikx]\exp[-ik\delta x]\exp[-k\beta x].$$

k is equal to $2\pi/\lambda$. In Eq. (1), the strictly real, exponential attenuation term is separated from the complex-valued terms of unit amplitude.

Consider propagation through a two-layer stack made from materials a and b that are formed on the surface of an EUV transmissive membrane as illustrated in FIG. 1. The electric fields at a distance L, greater than a plus b, is:

$$E(L)=\exp[ikL]\exp[-ik(\delta_a a+\delta_b b)]\exp[-k(\beta_a a+\beta_b b)], \qquad (2)$$

Relative to vacuum propagation, the phase shift through the material, $\Delta\phi$, is $$\Delta\phi=\delta_a a+\delta_b b. \qquad (3)$$

A logarithmic transmission parameter, t, can be defined as $$t=\beta_a a+\beta_b b. \qquad (4)$$

The actual amplitude and intensity transmission ratios through the bilayer material are exp(−kt) and exp(−2kt) respectively, where k equals $2\pi/\lambda$.

At this point, specific solutions for layer thicknesses can be derived for the desired performance parameters of the system. The next section (B) below considers material configurations required to achieve arbitrary phase-shift and amplitude, and the last section (C) presents a solution for arbitrary phase-shift with uniform transmission. Both derivations utilize the notation of this section (A).

B. Arbitrary Transmission and Phase Shift

To achieve arbitrary transmission and phase-shift in the same device requires that several constraints be imposed. Since it is not possible to have absorption without phase-shift or to have phase-shift without absorption, the inventive optical element must have some baseline phase-shift and absorption. One goal is to design a device that enables zero to $\pi$ (at least) or zero to $2\pi$ phase shift relative to the baseline, and relative amplitude transmission from 100% to some finite small amount, for example 1%.

Following the above discussion, the relative phase shift, $\Delta\phi$, through a section of the device with a thickness $a'$ of material a, and a thickness $b'$ through material b is $$\Delta\phi = \delta_a a' + \delta_b b'. \tag{5}$$

The logarithmic transmission, t, through the material is $$t = \beta_a a' + \beta_b b'. \tag{6}$$

The light propagation through the device in matrix form, as $$\begin{pmatrix} \Delta\phi \\ t \end{pmatrix} = \begin{pmatrix} \delta_a & \delta_b \\ \beta_a & \beta_b \end{pmatrix} \begin{pmatrix} a' \\ b' \end{pmatrix} = M \begin{pmatrix} a' \\ b' \end{pmatrix}. \tag{7}$$

M is called the characteristic matrix of the two-layer material. This operation can be inverted to yield the layer thicknesses required for arbitrary $\Delta\phi$ and t.

$$\begin{pmatrix} a' \\ b' \end{pmatrix} = \frac{1}{\delta_a \beta_b - \delta_b \beta_a} \begin{pmatrix} \beta_b & -\delta_a \\ -\beta_b & \delta_a \end{pmatrix} \begin{pmatrix} \Delta\phi \\ t \end{pmatrix} \tag{8}$$

$$= p \begin{pmatrix} \beta_b & -\delta_a \\ -\beta_b & \delta_a \end{pmatrix} \begin{pmatrix} \Delta\phi \\ t \end{pmatrix} = M^{-1} \begin{pmatrix} \Delta\phi \\ t \end{pmatrix},$$

where p is defined as $$p \equiv \frac{1}{\delta_a \beta_b - \delta_b \beta_a}, \tag{9}$$

and the inverse of the characteristic matrix is $$M^{-1} = p \begin{pmatrix} \beta_b & -\delta_a \\ -\beta_b & \delta_a \end{pmatrix}. \tag{10}$$

Expanding the matrix, yields the following equations for the layer thicknesses $$a' = p(\beta_b \Delta\phi - \delta_a t)$$

$$b' = p(-\beta_b \Delta\phi + \delta_a t) \tag{11}$$

As is apparent from Eq. (11), in order to satisfy arbitrary phase and amplitude requirements, the layer thicknesses, $a'$ and $b'$ may take positive or negative values. As stated previously, the way to accomplish this in practice is to begin with an initial, base thickness of each material, $a_o$ and $b_o$. The net material thicknesses, a and b, are given by $$a = a_0 + a' = a_0 + p(\beta_b \Delta\phi - \delta_a t)$$

$$b = b_0 + b' = b_0 + p(-\beta_b \Delta\phi + \delta_a t) \tag{12}$$

In matrix form, Eq. (3) may be written $$\begin{pmatrix} a \\ b \end{pmatrix} = \begin{pmatrix} a_0 \\ b_0 \end{pmatrix} + \begin{pmatrix} a' \\ b' \end{pmatrix} = \begin{pmatrix} a_0 \\ b_0 \end{pmatrix} + M^{-1} \begin{pmatrix} \Delta\phi \\ t \end{pmatrix}, \tag{13}$$

The base thicknesses must be chosen large enough that the total thickness called for in Eq. (11) is never less than zero. This requirement affects the minimum and maximum phase-shift and transmission values as follows:

$$a_0 > p(\delta_a t_{min} - \beta_b \Delta\phi_{max})$$

$$b_0 > p(\beta_b \Delta\phi_{min} - \delta_a t_{max}) \tag{14}$$

Note that $\beta$ is positive definite.

C. Uniform Transmission with Arbitrary Phase Shift

Figure 2:
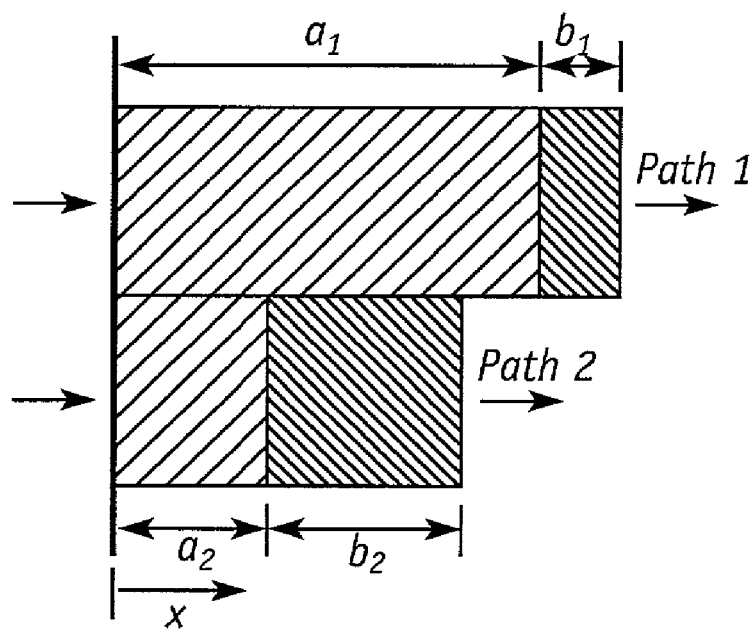
FIG. 2 illustrates two different regions of a bi-layer optical element constructed from two different materials.

The bilayer system can be designed to have uniform transmission with arbitrary phase shift values. This attribute is important in the creation of a pure phase-modulating optical element. As an illustration, consider propagation through two bi-layer stacks made from materials a and b as illustrated in FIG. 2. The two independent light paths, paths 1 and 2, traverse different regions of the two-layer stacks with independent thicknesses. (Light propagates from left to right in this diagram.) In path 1, the materials have thicknesses $a_1$ and $b_1$, in path 2, the thicknesses are $a_2$ and $b_2$. For the two cases, the electric fields at a distance L, greater than a plus b in either path, is $$E_1(L) = \exp[ikL]\exp[-ik(\delta_a a_1 + \delta_b b_1)]\exp[-k(\beta_a a_1 + \beta_b b_1)],$$

$$E_2(L) = \exp[ikL]\exp[-ik(\delta_a a_2 + \delta_b b_2)]\exp[-k(\beta_a a_2 + \beta_b b_2)]. \tag{15}$$

The condition that assures that the two paths have the same transmitted amplitude is $$\beta_a a_1 + \beta_b b_1 = \beta_a a_2 + \beta_b b_2. \tag{16}$$

As before, a constant parameter, t, can be defined to represent the logarithmic amplitude transmission. Since the transmission is uniform for all paths, for both cases, $$t = \beta_a a + \beta_b b. \tag{17}$$

(Recall that the actual amplitude and intensity transmission ratios through this two-layer material are exp(−kt) and exp(−2kt) respectively.) This relationship sets the thickness of one layer in terms of the other $$b = \frac{1}{\beta_b}(t - \beta_a a). \tag{18}$$

For the two materials, $$b_1 = \frac{1}{\beta_b}(t - \beta_a a_1), \text{ and } b_2 = \frac{1}{\beta_b}(t - \beta_a a_2). \quad (19a, 19b)$$

Given this fixed attenuation, the relative phase-shift between case 1 and case 2 is $\Delta\phi$, measured in waves. $\Delta\phi$ can be calculated from Eqs. (19a, 19b).

$$\Delta\phi = (\delta_a a_1 + \delta_b b_1)/\lambda - (\delta_a a_2 - \delta_b b_2)/\lambda \quad (20)$$

$$= \delta_a(a_1 - a_2)/\lambda + \delta_b(b_1 - b_2)/\lambda$$

A substitution can be made for thicknesses $b_1$ and $b_2$ in Eq. (20), and the result contains the thickness difference of the first material only. The relative phase change becomes $$\Delta\phi = \frac{1}{\lambda}\left(\frac{\beta_a}{\beta_b}\delta_b - \delta_a\right)(a_2 - a_1). \quad (21)$$

Given a thickness of material one, $a_1$, the thickness of material two is $$a_2 = \frac{\lambda\beta_b}{\beta_a\delta_b - \beta_b\delta_a}\Delta\phi + a_1. \quad (22)$$

Since the phase-shift difference depends on the thickness difference between layer one and layer two, and since high transmission requires minimum thickness, the maximum phase shift will occur when one layer has zero thickness.

The bilayer system of FIG. 2 has two bilayer structures that are contiguous, that is, the two bilayer structures are adjacent and in contact with each other. It is understood that the pattern of bilayer structures of the inventive device can comprise gaps between the bilayer structures so that radiation is phase shifted and attenuated with respect to radiation passing through the gaps.

The invention also embodies diffractive optical elements that have single layer structures rather than bilayer structures. For example, one structure has a layer of material "a" and the other structure has a layer of material "b". In this fashion, the optical paths defined by the structures allow for relative phase shifting as in the embodiment having bilayer structures.

C. (1) Defining Parameters for Arbitrary Phase-Shift Values with Uniform Transmission Consider the case where the greatest phase difference desired is $\Phi$. This difference occurs between two beam paths in which path one is composed only of material b, and path two only of material a. The thickness of material a in path two, from Eq. (22) is $$a_{2,max} = \frac{\lambda\beta_b}{\beta_a\delta_b - \beta_b\delta_a}\Phi. \quad (23)$$

This is the maximum thickness of material a that will be required. The transmission in path two is $$t = \beta_a a_{2,max} = \frac{\lambda\beta_a\beta_b}{\beta_a\delta_b - \beta_b\delta_a}\Phi. \quad (24)$$

This is the uniform amplitude transmission assigned to all paths. Furthermore, Eq. (24) is the important relationship between the amplitude transmission, t, and the maximum relative phase shift in a path, $\Phi$, measured in waves. The thickness of material b that gives us this same transmission in path one is $$b_{1,max} = \frac{t}{\beta_b} = \frac{\lambda\beta_a}{\beta_a\delta_b - \beta_b\delta_a}\Phi. \quad (25)$$

This is the maximum thickness of material b that is required for any path. Now the maximum thicknesses of materials a and b are known. As stated above, the maximum relative phase shift occurs in paths with only material a present. The thicknesses of material a and b parametrically, can be defined with respect to a desired relative phase-shift, $\Delta\phi$. From Eq. (22), $$a(\Delta\phi) = \frac{\beta_b\lambda}{\beta_a\delta_b - \beta_b\delta_a}\Delta\phi. \quad (26)$$

And, from Eqs. (18), (24), and (25)

$$b(\Delta\phi) = \frac{\beta_a\lambda}{\beta_a\delta_b - \beta_b\delta_a}(\Phi - \Delta\phi). \quad (27)$$

Notice that both functions are linear in the relative phase-shift parameter, $\Delta\phi$. Remember that both $\Delta\phi$ and $\Phi$ are measured in waves. Define the constant, p, to describe the fraction $$p \equiv \frac{1}{\beta_a\delta_b - \beta_b\delta_a}. \quad (28)$$

Now the parameterized layer thicknesses are $$a(\Delta\phi) = p\beta_b\lambda\Delta\phi, \text{ and } b(\Delta\phi) = p\beta_a\lambda(\Phi - \Delta\phi). \quad (29)$$

C. (2) Examples of Uniform Transmission with Arbitrary Phase Shift

The optical properties of materials commonly used with EUV optics are given and several potential materials pairings are presented in the following discussion. The following table contains the real and imaginary components $\delta$ and $\beta$ that describe the complex index of refraction of several potential EUV diffuser materials.

| Element | Atomic Wt. | Density (g/cm3) | $\delta$ | $\beta$ |
| --- | --- | --- | --- | --- |
| beryllium Be | 4 | 1.85 | 0.010862 | 0.0018000 |
| carbon C | 6 | 2.20 | 0.037875 | 0.0067526 |
| silicon Si | 14 | 2.33 | 9.227310-5 | 0.0018213 |
| cobalt Co | 27 | 8.90 | 0.066079 | 0.065340 |
| nickel Ni | 28 | 8.90 | 0.051510 | 0.071647 |
| molybdenum Mo | 42 | 10.2 | 0.077328 | 0.0062296 |
| ruthenium Ru | 44 | 12.4 | 0.11026 | 0.016545 |
| gold Au | 79 | 19.3 | 0.10009 | 0.049928 |

Three respective pairings are considered: Be/Si, Mo/C, and Ru/Ni. The calculated appropriate layer thicknesses for the two materials used to produce one or two waves of phase-shift are shown in FIGS. 3, 4, and 5. In addition, the net thickness of the bilayers is also shown.

Figure 3C:
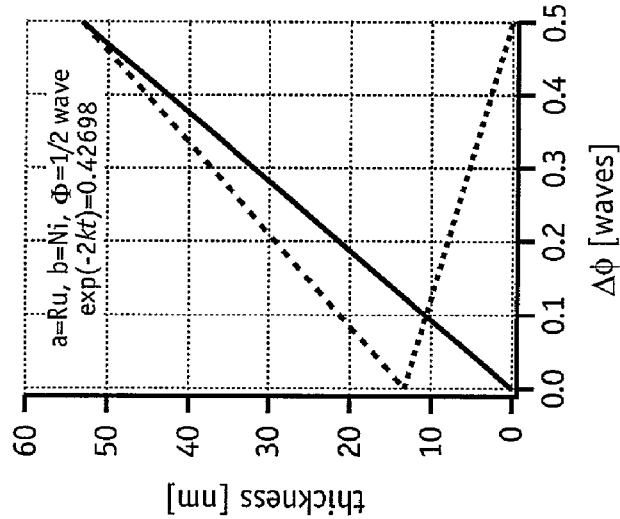
FIGS. 3A, 3B, and 3C are graphs that show the appropriate layer thicknesses for three sets of two materials used to produce one-half wave of phase-shift.
Figure 3B:
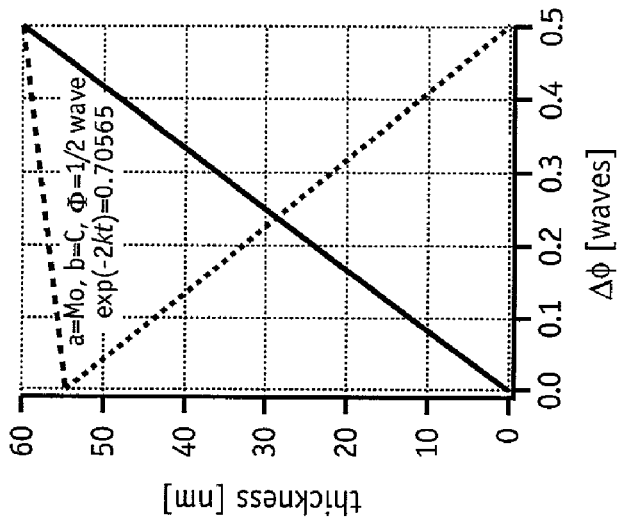
Figure 3A:
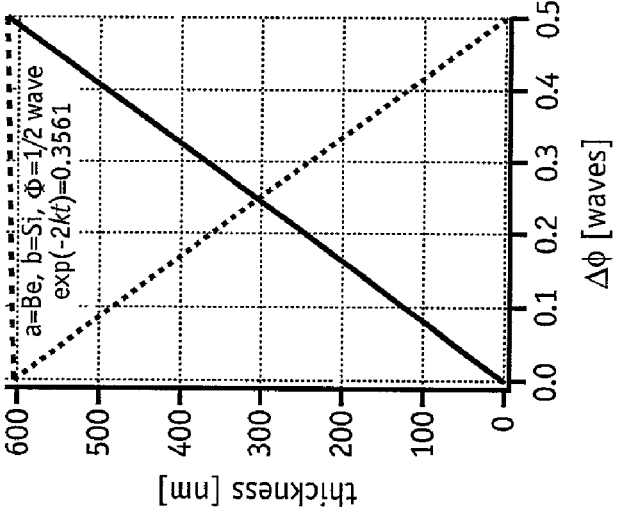

FIGS. 3A, 3B and 3C depict the required thicknesses for one-half wave phase-shift for Be/Si, Mo/C, and Ru/Ni, respectively. The solid line indicates the thickness of the stronger phase-shifting layer (material a), the sparse dashed line is the thicknesses of the second material (material b), and the longer-dashed line is the net thickness of the pair. Notice that the materials with well matched absorption, $\beta_a \approx \beta_b$ have nearly uniform net thickness.

Figure 4A:
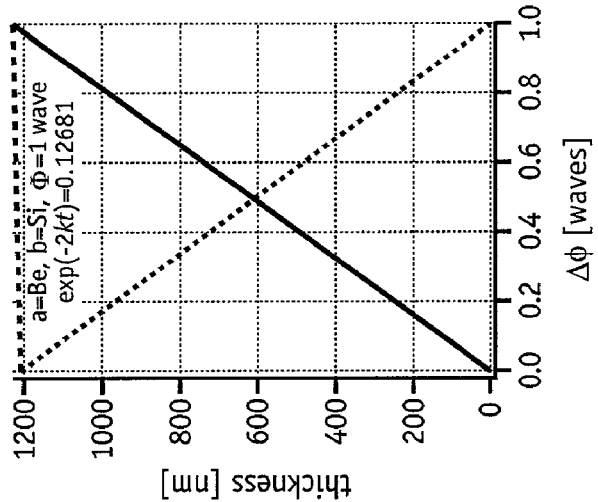
FIGS. 4A, 4B, and 4C are graphs that show the appropriate layer thicknesses for three sets of two materials used to produce one wave of phase-shift.
Figure 4B:
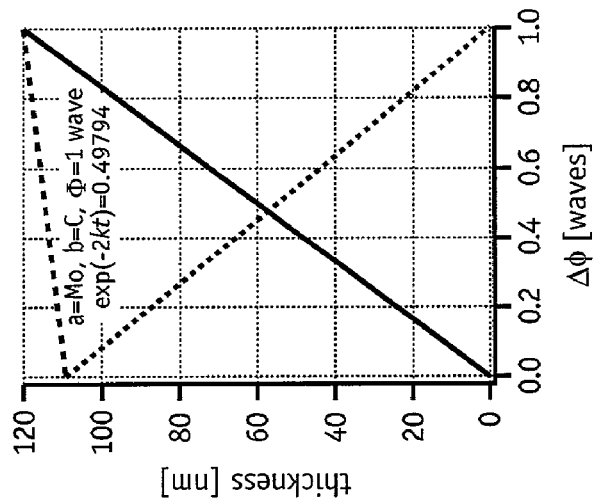
Figure 4C:
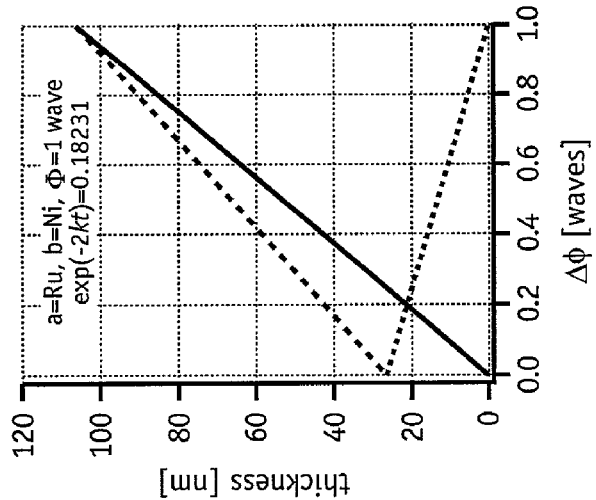

Similarly, FIGS. 4A, 4B and 4C depict the required thicknesses for one wave phase-shift for Be/Si, Mo/C, and Ru/Ni, respectively.

Figure 5A:
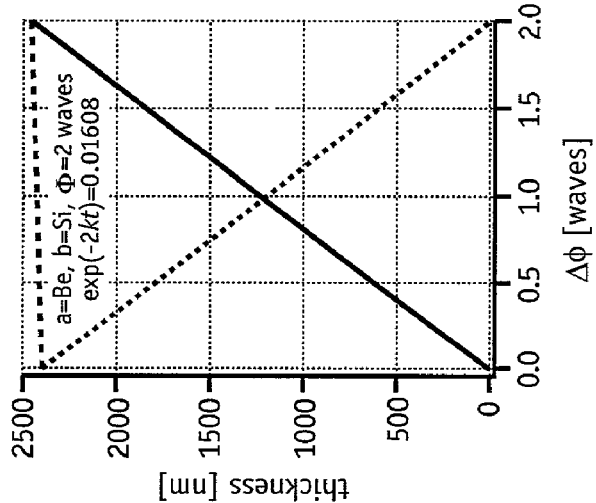
FIGS. 5A, 5B, and 5C are graphs that show the appropriate layer thicknesses for three sets of two materials used to produce two waves of phase-shift.
Figure 5B:
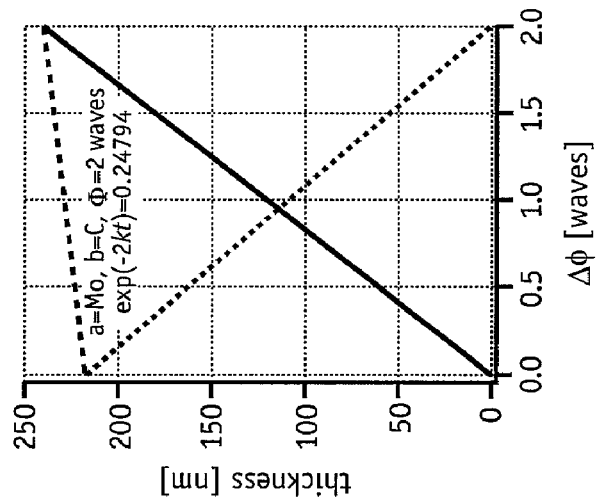
Figure 5C:
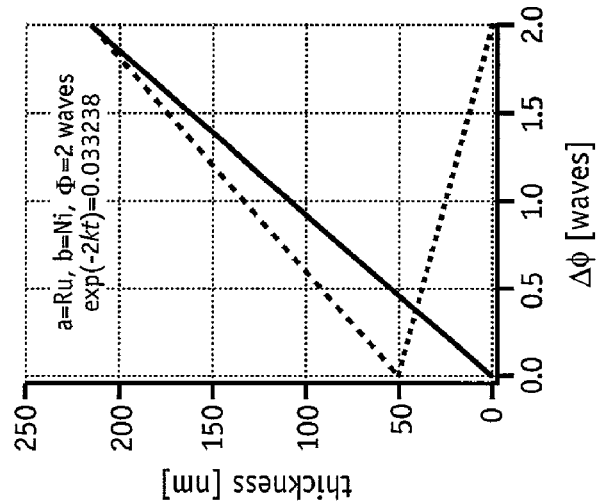

Finally, FIGS. 5A, 5B and 5C depict the required thicknesses for two waves phase-shift for Be/Si, Mo/C, and Ru/Ni, respectively.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An optical element for extreme ultraviolet (EUV) radiation wavefront control that comprises:
    a pattern of at least two bilayer structures with a first bilayer structure comprising a first layer of a first material and a second layer of a second material and a second bilayer structure comprising a third layer of the first material and a fourth layer of the second material, wherein the thickness of the first layer is different than that of the third layer and the thickness of the second layer is different than that of the fourth layer and wherein the pattern is formed on the planar surface of a substrate or membrane and wherein the first material has a different index of refraction than that of the second material and characterized in that incident EUV radiation passing through a first bilayer structure is phase shifted relative to EUV radiation passing through a second bilayer structure by a desired value and characterized in that radiation passing through the first bilayer structure exhibits an amplitude transmission reduction of a desired first value and that radiation passing through the second bilayer structure exhibits an amplitude transmission reduction of a desired second value.

2. The optical element of claim 1 wherein the radiation is phase shifted by approximately an odd multiple off $\pi$ radians.

3. The optical element of claim 1 wherein the first material has approximately the same absorptive to radiation as that of the second material and the thicknesses of the bilayer structures are approximately the same.

4. The optical element of claim 1 wherein the radiation is phase-shifted and the amplitude transmission ranges from 100% to less than 1%.

5. The optical element of claim 1 wherein the first and second materials are selected from the following pairs of materials: (i) beryllium and silicon, (ii) molybdenum and carbon, and (iii) ruthenium and nickel.

6. The optical element of claim 1 wherein the pattern is formed on a membrane that has one or more apertures.

7. The optical element of claim 6 wherein the membrane is substantially transmissive to the radiation.

8. The optical element of claim 1 wherein the substrate or membrane is made of silicon nitride or silicon.

9. A method of fabricating an optical element for extreme ultraviolet (EUV) radiation wavefront control that comprises:
    forming a pattern of at least two bilayer structures with a first bilayer structure comprising a first layer of a first material of a first thickness and a second layer of a second material of a second thickness, and a second bilayer structure comprising a third layer of the first material of a third thickness and a fourth layer of the second material of a fourth thickness, wherein the first thickness is different than the third thickness and the second thickness is different than the fourth thickness and wherein the pattern is formed on the planar surface of a substrate or membrane that is made of a third material and wherein the first material has a different index of refraction than that of the second material such that incident EUV radiation passing through a first bilayer structure is phase shifted relative to EUV radiation passing through a second bilayer structure by a desired value and characterized in that radiation passing through the first bilayer structure exhibits an amplitude transmission reduction of a desired first value and that radiation passing through the second bilayer structure exhibits an amplitude transmission reduction of a desired second value.

10. The method of claim 9 wherein for a given bilayer structure, said bilayer structure is formed by:
    (i) calculating the combination of thicknesses of a layer of the first material and a layer of the second material required to achieve the desired phase shift relative to the incident radiation; and
    (ii) depositing the layer of the first material and the layer of the second material to create the bilayer structure.

11. The method of claim 9 wherein for a given bilayer structure, the thicknesses are selected so that the structure exhibits a spatially varying amplitude transmission reduction of a desired value.

12. The method of claim 9 wherein the radiation is phase shifted by approximately an odd multiple of $\pi$ radians.

13. The method of claim 12 wherein the radiation is phase-shifted and the amplitude transmission ranges from 100% to 1%.

14. The method of claim 9 wherein the first material has approximately the same absorptivity to radiation as that of the second material and the thicknesses of the bilayer structures are approximately the same.

15. The method of claim 9 wherein the pattern defines contiguous bilayer structures and is characterized in that the radiation passing through each bilayer structure does not all exhibit the same phase shift.

16. The method of claim 9 wherein the first and second materials are selected from the following pairs of materials: (i) beryllium and silicon, (ii) molybdenum and carbon, and (iii) ruthenium and nickel.

17. The method of claim 9 wherein the pattern is formed on a substrate that has one or more apertures.

18. The method of claim 9 wherein the substrate is substantially transmissive to the radiation.

19. The method of claim 9 wherein the substrate or membrane is made of silicon nitride or silicon.

* * * * *